United States Patent
Cha

(10) Patent No.: US 10,943,183 B2
(45) Date of Patent: Mar. 9, 2021

(54) ELECTRONICS DEVICE PERFORMING SOFTWARE TRAINING ON MEMORY CHANNEL AND MEMORY CHANNEL TRAINING METHOD THEREOF

(71) Applicant: SAMSUNG ELECTRONICS CO., LTD., Suwon-si (KR)

(72) Inventor: Gyu-Hwan Cha, Suwon-si (KR)

(73) Assignee: Samsung Electronics Co., Ltd., Suwon-si (KR)

(*) Notice: Subject to any disclaimer, the term of this patent is extended or adjusted under 35 U.S.C. 154(b) by 996 days.

(21) Appl. No.: 15/489,762

(22) Filed: Apr. 18, 2017

(65) Prior Publication Data

US 2018/0018583 A1 Jan. 18, 2018

(30) Foreign Application Priority Data

Jul. 12, 2016 (KR) .................. 10-2016-0088038

(51) Int. Cl.
  *G06N 20/00* (2019.01)
  *G11C 29/50* (2006.01)
  *G11C 29/02* (2006.01)
  *G11C 7/22* (2006.01)
  *G06F 3/06* (2006.01)

(52) U.S. Cl.
  CPC .......... *G06N 20/00* (2019.01); *G06F 3/061* (2013.01); *G06F 3/0619* (2013.01); *G06F 3/0634* (2013.01); *G06F 3/0655* (2013.01); *G06F 3/0685* (2013.01); *G11C 7/222* (2013.01); *G11C 29/022* (2013.01); *G11C 29/023* (2013.01); *G11C 29/028* (2013.01); *G11C 29/50012* (2013.01)

(58) Field of Classification Search
  CPC . G11C 29/50012; G11C 29/50; G11C 29/023; G11C 29/02; G11C 29/028; G11C 29/022; G11C 7/222; G11C 29/22; G06F 3/0619; G06F 3/0634; G06F 3/0655; G06F 3/0685
  See application file for complete search history.

(56) References Cited

U.S. PATENT DOCUMENTS

| | | |
|---|---|---|
| 7,974,141 B2 | 7/2011 | Fox et al. |
| 8,495,330 B2 | 7/2013 | Vergis et al. |
| 8,638,622 B2 | 1/2014 | Wang et al. |
| 8,812,892 B1 | 8/2014 | Hill et al. |
| 8,819,474 B2 | 8/2014 | Schoenborn et al. |
| 2004/0139290 A1* | 7/2004 | Wolrich ............ G06F 12/0607 711/157 |
| 2008/0320254 A1* | 12/2008 | Wingard ........... G06F 15/17375 711/157 |
| 2009/0300278 A1 | 12/2009 | Kruger |
| 2012/0284576 A1 | 11/2012 | Housty et al. |

(Continued)

FOREIGN PATENT DOCUMENTS

KR 20090045753 A 5/2009

*Primary Examiner* — Li Wu Chang
(74) *Attorney, Agent, or Firm* — Volentine, Whitt & Francos, PLLC

(57) ABSTRACT

An electronic device includes a memory device storing data and a system-on-a-chip using the memory device as a working memory. The system-on-a-chip performs software training on a second memory area of the memory device by loading a training code to a first memory area of the memory device, and executing the loaded training code.

17 Claims, 15 Drawing Sheets

(56) References Cited

U.S. PATENT DOCUMENTS

| | | | |
|---|---|---|---|
| 2014/0250281 A1* | 9/2014 | Rao | G06F 12/0223 |
| | | | 711/156 |
| 2014/0369597 A1* | 12/2014 | Shulman | G06K 9/6263 |
| | | | 382/159 |
| 2014/0376295 A1 | 12/2014 | Oh et al. | |
| 2015/0143186 A1 | 5/2015 | Benedict | |
| 2015/0378603 A1 | 12/2015 | Dearth et al. | |

* cited by examiner

☐ : Training Code
▨ : Training Data (a) default     (b) Adjusted interleaving size

ELECTRONICS DEVICE PERFORMING SOFTWARE TRAINING ON MEMORY CHANNEL AND MEMORY CHANNEL TRAINING METHOD THEREOF

CROSS-REFERENCE TO RELATED APPLICATIONS

A claim for priority under 35 U.S.C. § 119 is made to Korean Patent Application No. 10-2016-0088038 filed Jul. 12, 2016, in the Korean Intellectual Property Office, the entire contents of which are hereby incorporated by reference.

BACKGROUND

Embodiments of the inventive concept disclosed herein relate to an electronic device, and in particular, to an electronic device performing software training on a memory channel and a memory channel training method thereof.

There is a dramatically increasing use of mobile devices such as a smartphone, a tablet personal computer (PC), a digital camera, an MP3 player, personal digital assistant (PDA), and a wearable device. An application processor (AP) is used as a core driving processor of a mobile device. In addition, a volatile memory device, such as a dynamic random access memory (DRAM), is used a main memory or a working memory of the AP including various intellectual property cores (IP cores). The demand for high-performance and high-capacity memories accompanies a sharp increase in an operating frequency and a storage capacity of the working memory.

The increases in the operating speed makes it difficult to secure the reliability of data exchanged between the AP and the working memory, for example, a DRAM. To secure the reliability of data, there is a need to optimize a reference voltage or clock timing of data or signals transferred through an interface between the AP and the working memory. The optimizing of the clock timing means optimal synchronization between a clock signal (or a strobe signal) and data. The reference voltage provides a criterion for determining a logical value of data.

In general, training is performed on the DRAM for increasing the reliability of data. A DRAM channel may be optimized by executing software code for training. There is a trend in which the size of such training code for providing more functions and high reliability increases. However, increasing the capacity of a static random access memory (SRAM) for loading the training code having a larger size causes an excessive increase in costs. Also, attempts to load the training code to the DRAM having sufficient resources are sometimes prevented due to the barrier of channel interleaving.

SUMMARY

Embodiments of the inventive concept provide an electronic device that performs channel training on a memory, and a memory training method thereof.

According to an aspect of an embodiment, that is provided an electronic device which includes a memory device configured to store data, and a system-on-a-chip that uses the memory device as a working memory. The system-on-a-chip loads a training code into a first memory area of the memory device, and performs software training on a second memory area of the memory device by executing the loaded training code.

According to another aspect of an embodiment, there is provided a software training method of an electronic device that drives a memory device managed in units of channels as a working memory. The method includes: loading a training code into a first memory area of the memory device corresponding to a first channel of the memory device and loading training data into a second memory area of the memory device corresponding to a second channel of the memory device, accessing the training data stored in the second memory area in response to execution of the training code loaded into the first memory area, evaluating the training data read from the second memory area to ascertain an optimum value for an access parameter of the second channel, and setting an operating condition of the second channel by using the ascertained optimum value for the access parameter.

According to still another aspect of an embodiment, there is provided a computing system which includes a memory device that is driven as a working memory and a host connected to a plurality of channels and configured to load data to the memory device via the plurality of channels and to fetch the data from the memory device. The host performs software training on a second channel of the plurality of channels by: loading a training code into a memory area of the memory device corresponding to a first channel of the plurality of channels, and executing the loaded training code.

According to yet another aspect of an embodiment, there is provided a system comprising: a processor; and a volatile working memory of the processor which is configured to store data for processing by the processor, wherein the processor and volatile memory device communicate the data with each other. The processor is configured to: load a training code into a first memory area of the volatile working memory, load training data into a second memory area of the volatile working memory which is separate from the first memory area, and fetch and execute the training code loaded into the first memory area to perform software training on the second memory area of the volatile working memory for testing and adjusting one or more access parameters of the second memory area.

BRIEF DESCRIPTION OF THE FIGURES

The above and other objects and features will become apparent from the following description with reference to the following figures, wherein like reference numerals refer to like parts throughout the various figures unless otherwise specified.

DETAILED DESCRIPTION

Figure 1:
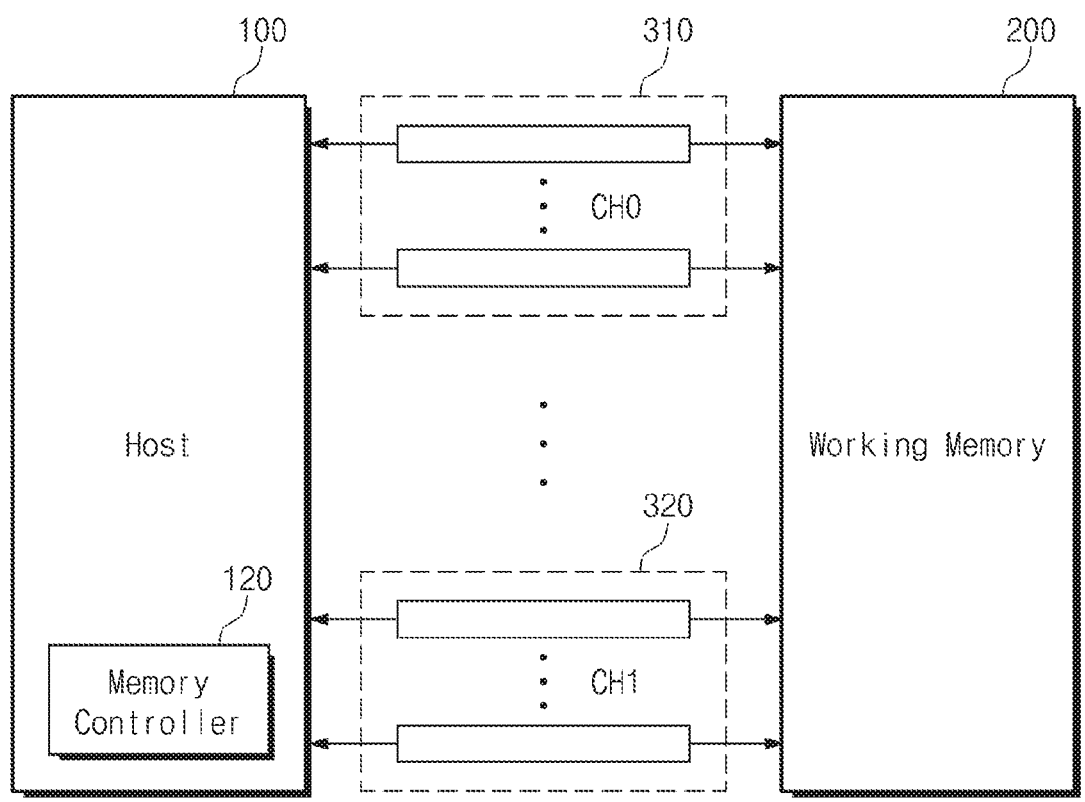
FIG. 1 is a block diagram illustrating an electronic device according to an embodiment of the inventive concept.

It should be understood that both the foregoing general description and the following detailed description are provided as examples, for illustration and not for limiting the scope of the inventive concept. Reference will now be made in detail to the embodiments of the inventive concept, examples of which are illustrated in the accompanying drawings. Wherever possible, the same reference numbers are used in the drawings and the description to refer to the same or like parts.

Below, a DRAM will be described as an example of a working memory to describe features and functions of the inventive concept. However, one skilled in the art may easily understand other features and performances from information disclosed herein. For example, the features of the inventive concept may be applied to a phase-change RAM (PRAM), a magnetoresistive RAM (MRAM), a resistive RAM (ReRAM), a ferroelectric RAM (FRAM), a NOR flash memory, etc. as a working memory. In this specification, the term "training" may mean an operation of searching for a latency or a signal level of a memory channel to provide an optimum reliability of data communication via the memory channel.

The inventive concept may be implemented or applied through other embodiments. In addition, the detailed description may be changed or modified according to view points and applications without departing from the claims, the scope and spirit, and any other purposes of the inventive concept. Below, embodiments of the inventive concept will be described in detail with reference to the accompanying drawings.

FIG. 1 is a block diagram illustrating an electronic device 10 according to an embodiment of the inventive concept. Referring to FIG. 1, electronic device 10 includes a host 100 and a working memory 200. A plurality of channels 310 and 320 are provided for exchanging data and signals between host 100 and working memory 200.

Host 100 may execute various applications in response to a request of a user. To execute applications, host 100 loads the applications to working memory 200. Host 100 may drive an operating system and may execute various applications on the operating system. To this end, host 100 may store data in working memory 200 or may read data stored in working memory 200.

Host 100 may include a memory controller 120 that controls working memory 200. Host 100 may provide a read request to memory controller 120 to read data stored in working memory 200. Memory controller 120 may access working memory 200 to read data that host 100 requests. To improve the access efficiency, memory controller 120 may control working memory 200 based on a channel interleaving technique.

Host 100 may perform training on working memory 200 in a booting operation or other specific situation. Host 100 may improve the reliability of a data or signal exchange with working memory 200 by performing the training. For example, host 100 may write or read training data TD into or from working memory 200 in various conditions to determine an optimum clock timing or a reference level to be employed in a memory channel between host 100, or memory controller 120, and working memory 200.

In particular, host 100 according to an embodiment of the inventive concept may load a training code TC for the training to working memory 200. The training code TC substantially corresponds to an execution code or instructions for performing the training. If an error occurs in the training code TC, overall training operations may fail. Accordingly, there is a need to secure the stability of the training code TC for securing the reliability of data or signals. Host 100 loads the training code TC to a first memory area of working memory 200 and loads the training data TD to a second memory area of working memory 200. Host 100 (i.e., a processor of host 100) may execute the training code TC after fetching the training code TC from the first memory area of working memory 200 and may perform the training on the second memory area of working memory 200 to determine a parameter or parameters which may provide an optimum reliability for communication between host 100 and working memory 200. It may, of course, be possible to load the training code TC to the second memory area of working memory 200 and to perform the training on the first memory area of working memory 200. A method of dividing a memory into the first and second memory areas, or a method of securing the first and second memory areas, will be described in detail with reference to the following drawings.

Memory controller 120 accesses working memory 200 in response to requests from various master IP cores of host 100. Memory controller 120 may output data DQ in synchronization with a strobe signal DQS in response to a request for accessing working memory 200. Alternatively, memory controller 120 may receive data DQ that is output from working memory 200 in synchronization with the strobe signal DQS. Memory controller 120 may access, for example, working memory 200 by a channel interleaving technique. As working memory 200 is accessed in the channel interleaving technique, data exchange may be made independently in units of channels. The channel interleaving technique will be described in detail with reference to FIG. 3.

Working memory 200 is driven as a main memory of electronic device 10. The operating system OS or basic application programs may be loaded into working memory 200 upon booting of electronic device 10. For example, when host 100 is booted up, an OS image stored in a storage device (not illustrated) is loaded into working memory 200 based on a booting sequence. Overall input/output operations of host 100 may be supported by the operating system. Likewise, application programs which are selected by a user or are for a basic service may be loaded into working memory 200. In addition, working memory 200 may be used as a buffer memory that stores image data provided from an image sensor such as a camera.

Working memory 200 may be a DRAM that is accessible in units of bytes. Working memory 200 may be implemented with an overwritable nonvolatile memory device. For example, working memory 200 may be implemented with a nonvolatile RAM such as a PRAM, an MRAM, a ReRAM, a FRAM, or a NOR flash. When electronic device 10 is driven, an operating system OS, a running application program, updated data, etc. are stored in working memory 200. Working memory 200 may be implemented in the form of a multi-chip package in which a plurality of chips are stacked, or in the form of a module. However, a manner of configuring working memory 200 is not limited to these examples.

Channels 310 and 320 provide paths for transferring data or signals between host 100 and working memory 200. Channels 310 and 320 correspond to data paths through which host 100 and working memory 200 transmit data independently. For example, data DQ and a strobe signal DQS may be transmitted through first channel 310 while any other data DQ and any other strobe signal DQS are transmitted through second channel 320. The driving and operating of channels 310 and 320 may be controlled by memory controller 120.

A configuration of working memory 200, to which the training code TC is loaded, and a configuration of host 100, which trains working memory 200 by using working memory 200, are above described simply. Compared to a manner in which the training code TC is loaded into an SRAM included in an existing host, the above-described manner may improve a speed at which the training code TC is loaded and fetched. In addition, the stability of the training code TC may be secured by excluding a channel or a memory area, to which the training code TC is loaded, from a training target.

Figure 2:
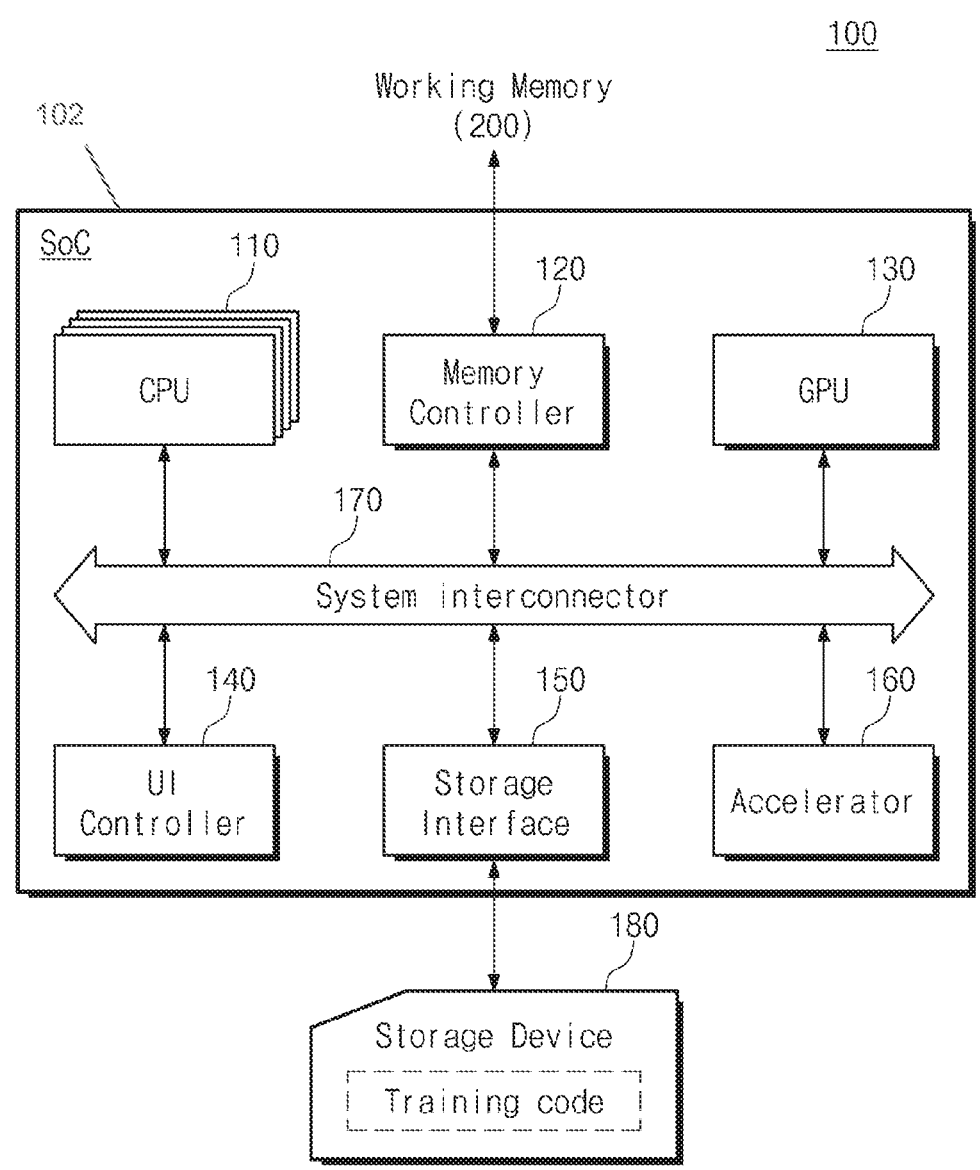
FIG. 2 is a block diagram illustrating a configuration of a host according to an embodiment of the inventive concept.

FIG. 2 is a block diagram illustrating a configuration of a host according to an embodiment of the inventive concept. Referring to FIG. 2, host 100 may include a system-on-a-chip SoC 102 and a storage device 180. Host 100 may further include devices including a liquid crystal display device and a touch panel which are not illustrated in FIG. 2.

System-on-a-chip SoC 102 may include one or more central processing units (CPU) 110, memory controller 120, a graphics processing unit (GPU) 130, a user interface (UI) controller 140, and an accelerator 160. However, it should be understood that components of system-on-a-chip SoC 102 are not limited to components illustrated in FIG. 2. For example, system on-chip-a-SoC 102 may further include a hardware codec for processing image data, a security block, etc.

CPU 110 executes software (e.g., an application program, an operating system, device drivers) to be executed in host 100. CPU 110 may execute the operating system OS loaded into working memory 200. CPU 110 may execute various application programs to be driven based on the operating system OS. In particular, CPU 110 may fetch and execute the training code TC loaded into working memory 200. CPU 110 may control memory controller 120 such that the training operation of working memory 200 requested according to the execution of the training code TC is performed. CPU 110 may be a homogeneous multi-core processor or a heterogeneous multi-core processor.

Memory controller 120 provides an interface between working memory 200 and system-on-a-chip SoC 102. Memory controller 120 may access working memory 200 in response to a request of CPU 110 or any other IP. For example, memory controller 120 may write data in working memory 200 in response to a write request of CPU 110. Alternatively, memory controller 120 may read data from working memory 200 and may provide the read data to CPU 100 or storage interface 150. During the training operation, in response to a request of CPU 110, memory controller 120 may release channel interleaving or may adjust a unit of the channel interleaving.

GPU 130 performs various graphic operations in response to a request of CPU 110. That is, GPU 130 may convert process-requested data into data suitable for a display (not illustrated). GPU 130 has an operation structure that is suitable for parallel processing in which similar operations are repeatedly processed. Accordingly, nowadays, GPU 130 is being developed to have a structure that may be used to perform various operations needing high-speed parallel processing as well as the graphic operation.

UI controller 140 controls user inputs to and outputs from and to UI devices (e.g., a keyboard, a touch panel, a display, a trackball, a keypad, a mouse, etc.). For example, UI controller 140 may display a keyboard screen and the like for inputting data to the display (not illustrated) under control of CPU 110. Alternatively, UI controller 140 may control the display such that the user-requested data is displayed. UI controller 140 may decode data, which is provided from user input devices such as a keyboard, a mouse, and a touch panel, to user input data.

Storage interface 150 accesses storage device 180 in response to a request of CPU 110. That is, storage interface 150 provides an interface between system-on-a-chip SoC 102 and storage device 180. For example, data processed by CPU 110 is stored in storage device 180 through storage interface 150. In addition, data stored in storage device 180 may be provided to CPU 110 through storage interface 150.

Accelerator 160 is implemented with a separate IP for improving a speed at which multimedia or multimedia data is processed. For example, accelerator 160 may be implemented with an IP core for improving the performance in which texts, audio, still images, animation, videos, two-dimensional data, or three-dimensional data is processed.

A system interconnector 170 is a system bus for providing an on-chip network inside system-on-a-chip SoC 102. System interconnector 170 may include, for example, a data bus, an address bus, and a control bus. The data bus is a path through data is transmitted. The data bus may mainly provide a memory access path through which working memory 200 or storage device 180 is accessed. The address bus provides an address exchange path between IP cores. The control bus provides a path through which control signals are transmitted between IP cores. However, a configuration of system interconnector 170 is not limited to the above description, and system interconnector 170 may further include arbitration devices for efficient management of the bus.

Storage device 180 is provided as a storage medium of host 100. Storage device 180 may store application programs, an OS image, and various kinds of data. In particular, the training code TC for training working memory 200 may be stored in a specific memory area of storage device 180. However, it may be well understood that the training code TC may be stored in any other nonvolatile memory instead of storage device 180. In some embodiments, storage device 180 may be implemented with a memory card (e.g., MMC, eMMC, SD, and microSD). Storage device 180 may include a NAND-type flash memory having a high storage capacity. Alternatively, storage device 180 may include a next-generation nonvolatile memory, such as a PRAM, an MRAM, a ReRAM, and a FRAM, or a NOR flash memory. As another example, storage device 180 may be an embedded memory that is included in system-on-a-chip SoC 102.

According to the above description, system-on-a-chip SoC 102 may load the training code TC to working memory 200 for the training of working memory 200. To load the training code TC to working memory 200, memory controller 120 may release (or deactivate) a channel interleaving mode of working memory 200. Alternatively, to load the training code TC to working memory 200, memory controller 120 may adjust the size of a channel interleaving unit of working memory 200.

Figure 3:
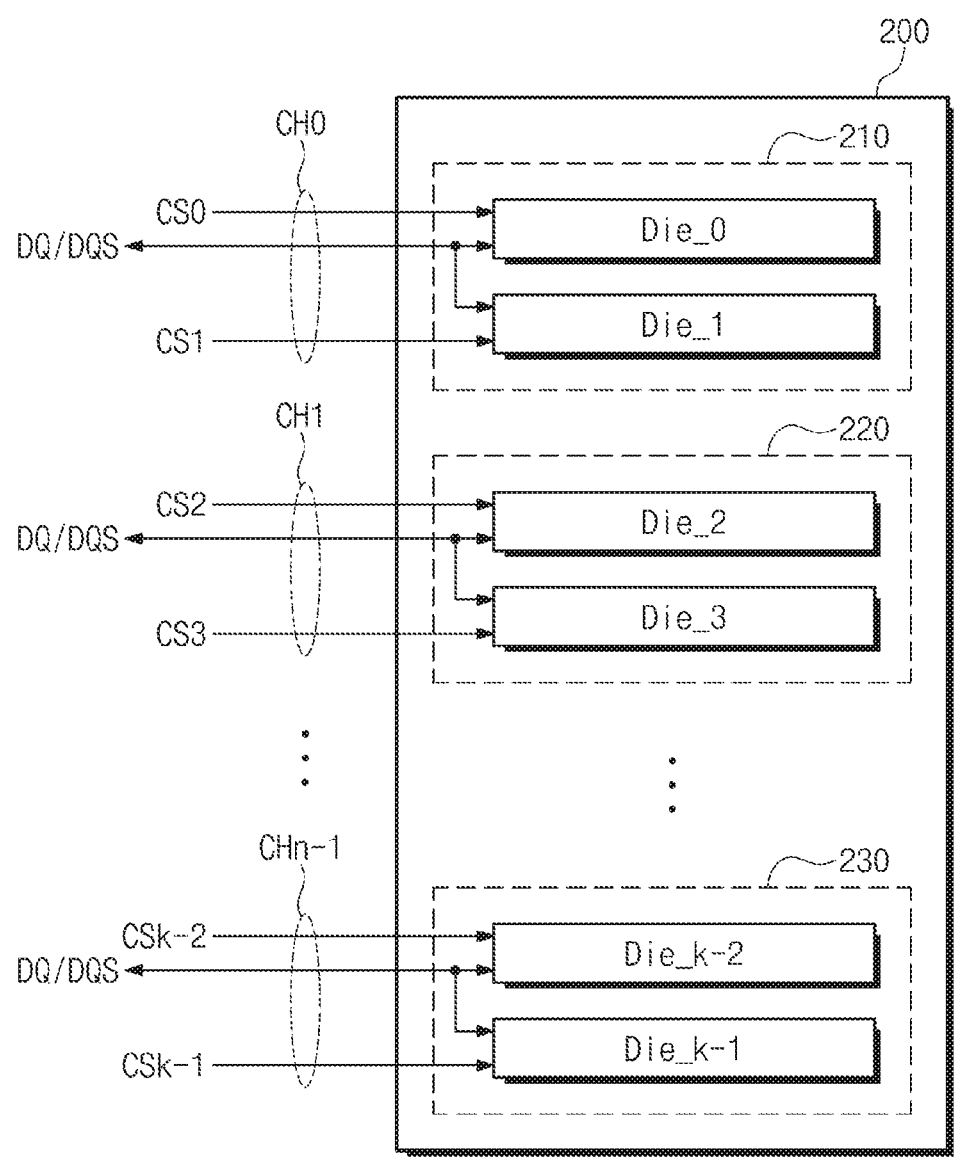
FIG. 3 is a block diagram illustrating a configuration of a working memory according to an embodiment of the inventive concept.

FIG. 3 is a block diagram illustrating a configuration of working memory 200 according to an embodiment of the inventive concept. Referring to FIG. 3, working memory 200 may include a plurality of DRAM dies Die_0, Die_1, Die_2, . . . , Die_k–1 that are managed in units of channels CH0, CH1, . . . , CHn–1.

Working memory 200 may be managed by memory controller 120 in the channel interleaving manner. For example, in the case where memory controller 120 writes data in working memory 200, write-requested data may be partitioned in an interleaving unit IU. Assuming that the interleaving unit IU is 128 bytes, write-requested data are partitioned in a unit of 128 bytes to respectively correspond to the channels CH0, CH1, . . . , CHn–1, and the partitioned portions of the data are written in the DRAM dies Die_0, Die_1, Die_2, . . . , Die_k–1 through the corresponding channels in a predetermined order. For example, if it is assumed that a channel interleaving sequence is "CH0→CH1→CH2→CH3→ . . . →CHn–1", the partitioned data of the interleaving unit IU of 128 bytes may be written in each channel in a pipeline manner. During a read operation, channels may be selected in the same manner as that described above, and data may be output through the channels thus selected.

If the channel CH0, in which two dies Die_0 and Die_1 are included, is selected, memory controller 120 activates a chip select signal CS0 or CS1 for selecting one of the dies Die_0 and Die_1. Afterwards, the strobe signal DQS and data DQ may be transferred. In this case, a signal line for transferring the strobe signal DQS and the data DQ is shared by the two dies Die_0 and Die_1, and one of the two dies Die_0 and Die_1 is selected by the chip select signals CS0 and CS1.

The loading of the training code TC to working memory 200 managed according to the above-described channel interleaving technique may decrease the stability of the training code TC. However, according to an embodiment, the channel interleaving may be released or deactivated at a time point when the training code TC is loaded. As another example, the channel interleaving unit IU may be adjusted to have a size which is large enough to contain the training code TC. Software training may be performed only for a memory area of working memory in which the training code TC is not stored. According to the software training method, it may be possible to improve the stability of the training code TC and to secure the reliability of memory training.

Figure 4A:
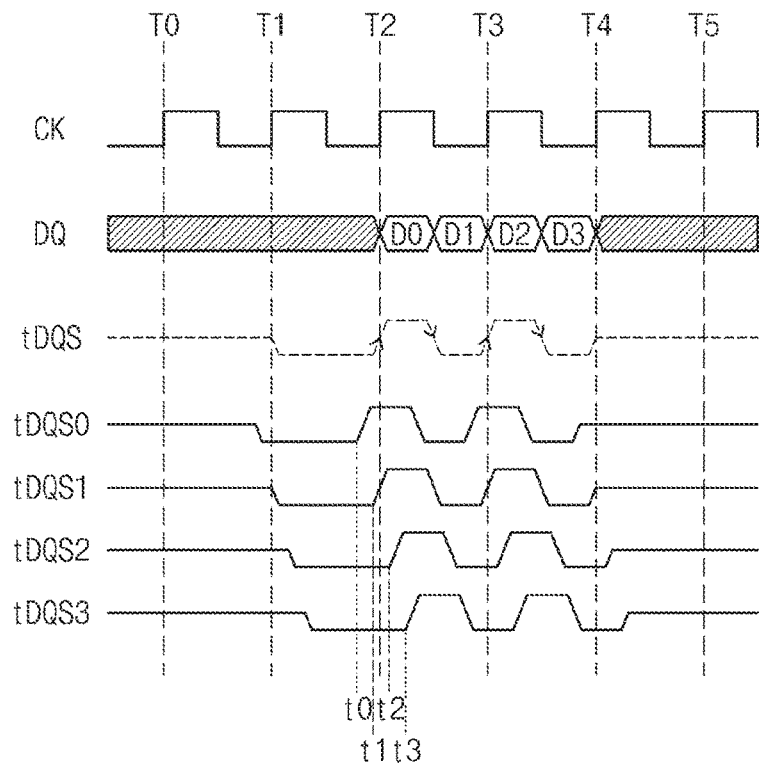
FIGS. 4A and 4B are waveform diagrams illustrating examples of software training of a memory.
Figure 4B:
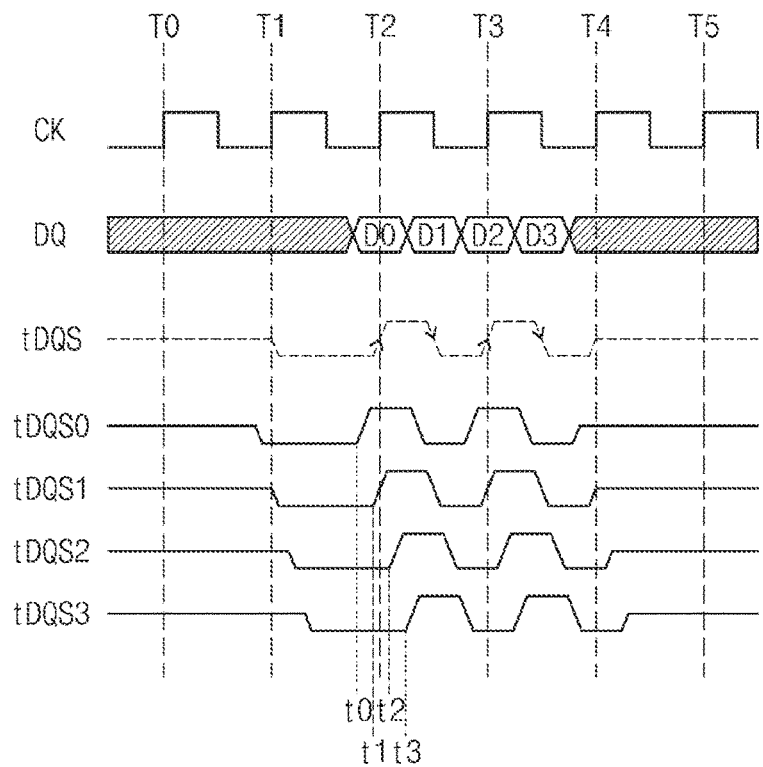

FIGS. 4A and 4B are waveform diagrams illustrating examples of software training of a memory. FIG. 4A is a waveform diagram illustrating a read training method of working memory 200, and FIG. 4B is a waveform diagram illustrating a write training method of working memory 200. In detail, FIG. 4A is a waveform diagram illustrating training of the strobe signal DQS in a read operation, and FIG. 4B is a waveform diagram illustrating training of the strobe signal DQS in a write operation.

Referring to FIG. 4A, as the training code TC loaded into a first memory area of working memory 200 is executed, software training of working memory 200 is performed on a second memory area thereof. Here, the first memory area may be memories 210 corresponding to, for example, the channel CH0. The second memory area may be the remaining memories (e.g., 220 and 230) other than the memories (or the first memory area) of the channel CH0, to which the training code TC is loaded.

As the training code TC is executed, an operation in which the training data TD is read from memories of the second memory area is performed according to a procedure illustrated in FIG. 4A. Through the execution of the training code TC, memory controller 120 may perform a training operation for finding a strobe signal tDQS having optimum timing. That is, memory controller 120 may control memory dies corresponding to the second memory area such that the memory dies output training data D0, D1, D2, and D3 by using strobe signals tDQS0, tDQS1, tDQS2, and tDQS3 having different delay values t0, t1, t2, and t3. The timing of the strobe signal DQS among strobe signals tDQS0, tDQS1, tDQS2, and tDQS3 which provides the highest reliability for the read data may be selected by the training code TC as the timing of a strobe signal to be used for future data read operations reading data from working memory 200.

An embodiment is exemplified as the training operation is performed in a manner in which strobe signals having different delays are provided during the read operation. However, this is only an example for better understanding. For example, it may be possible to adjust a clock signal CK or data DQ of the working memory for the read training.

Referring to FIG. 4B, write training of working memory 200 is performed on the second memory area as the training code TC loaded into the first memory area is executed. Here, the first memory area may be memories 210 corresponding to, for example, the channel CH0. The second memory area may be the remaining memories (e.g., 220 and 230) other than the memories (or the first memory area) of the channel CH0, to which the training code TC is loaded.

As the training code TC is executed, training data D0, D1, D2, and D3 may be written into memories of the second memory area by using strobe signals tDQS0, tDQS1, tDQS2, and tDQS3 of various delays. An optimum strobe signal among strobe signals tDQS0, tDQS1, tDQS2, and tDQS3 may be selected as the timing of a strobe signal to be used for future data write operations writing data to working memory 200 according to the result of detecting the reliability or an error rate of the written data.

An operation of detecting the optimum timing of the data DQ and the strobe signal DQS is described as an example of the software training. However, the software training of the working memory 200 may be performed on various signals or settings in addition to the data DQ and the strobe signal DQS.

Figure 5:
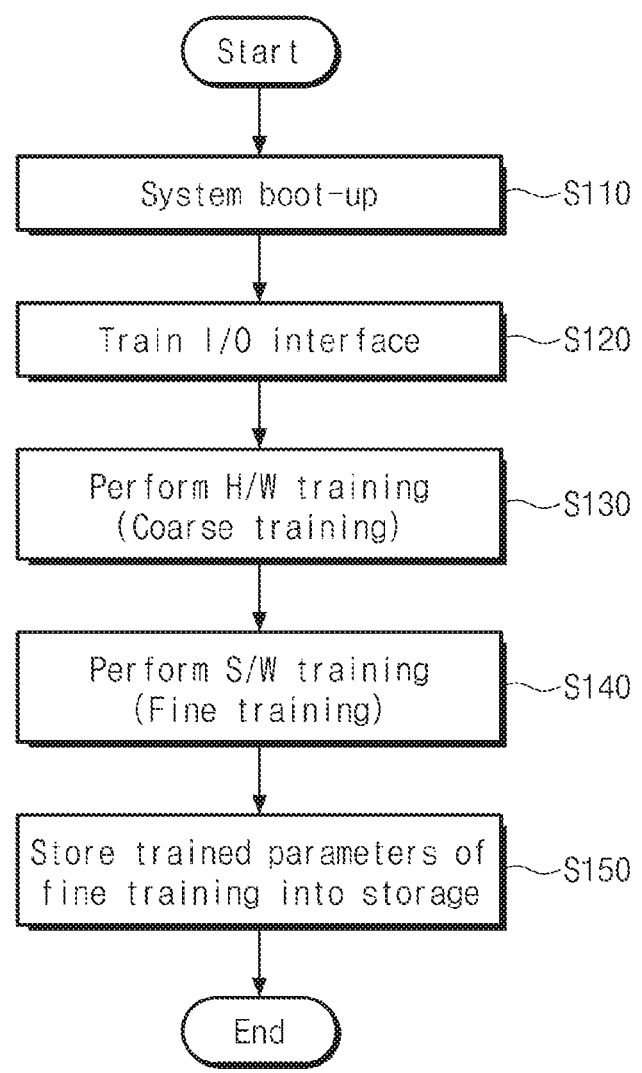
FIG. 5 is a flowchart illustrating an embodiment of a training method of a working memory to which a training code is loaded.

FIG. 5 is a flowchart illustrating an embodiment of a training method of a working memory to which a training code is loaded. Referring to FIG. 5, the training code TC is loaded into the first memory area of working memory 200, and the software training is performed on the second memory area of working memory 200 by executing the training code TC.

In operation S110, electronic device 10 is booted up. For example, a power switch of electronic device 10 may be turned on, or a booting operation thereof may be performed when an initialization operation is performed by a hardware reset.

In operation S120, training may be performed on overall input/output interfaces of electronic device 10. That is, before memory training is performed on working memory 200, training operations for securing minimum reliability may be performed in operation S120.

In operation S130, hardware training is performed on working memory 200. The hardware training may be, for example, an operation of setting memory controller 120 with an initial value parameter that is previously defined in working memory 200. The minimum reliability for an access to working memory 200 may be obtained through the hardware training. The hardware training may be called "coarse training."

In operation S140, software training is performed on working memory 200. The software training corresponds to fine training for finely adjusting the parameter that is determined by the hardware training. As illustrated in FIGS. 4A and 4B, the software training is a procedure for again adjusting the parameter determined by the hardware training to have a value for providing data timing having the optimum reliability. During the software training according to an embodiment of the inventive concept, the training code TC may be loaded into working memory 200 corresponding to a training target. That is, the training code TC for performing the software training is loaded into the first memory area of working memory 200. When the training code TC is executed, the software training may be performed on memories of the second memory area to which the training code TC is not loaded.

In operation S150, an optimized operating parameter that is determined based on the result of the software training may be stored in storage device 180. The optimized operation parameter stored in storage device 180 may be used to skip the software training procedure in a subsequent booting operation.

According to the above-described software training method, the training code TC may be loaded into working memory 200 corresponding to a training target. Accordingly, the restriction on the size of the training code TC may be removed. This may mean that it is possible to implement software training of various functions and performance criteria. In addition, since the training code TC is loaded into the working memory of which a speed is higher than that of an SRAM accessible through system interconnector 170 or a bus, it may be possible to shorten the time needed to load and fetch the training code TC. This may mean an increase in a software training speed of working memory 200.

Figure 6:
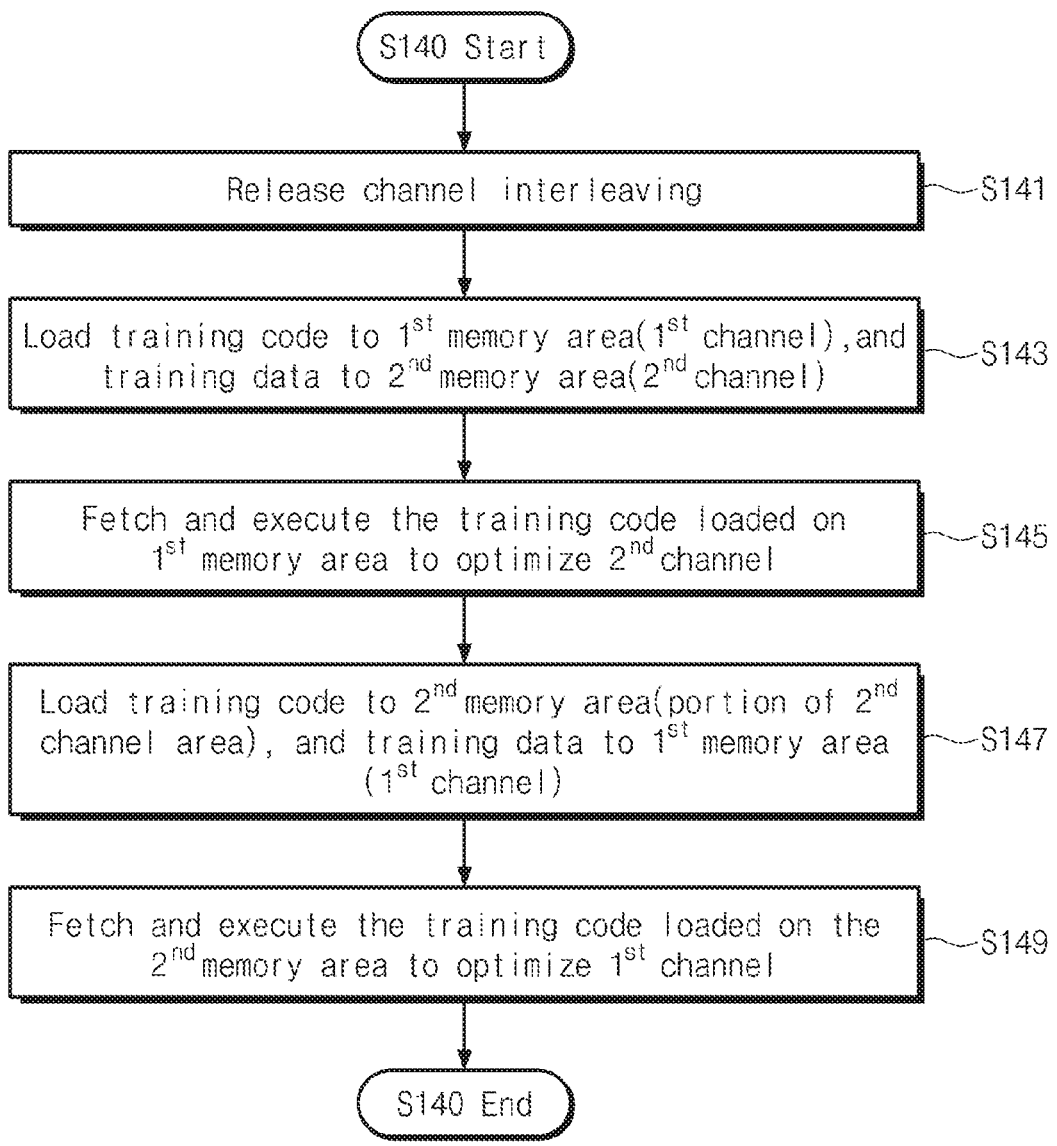
FIG. 6 is a flowchart illustrating a software training procedure of FIG. 5 in detail.

FIG. 6 is a flowchart illustrating a software training procedure (S140) of FIG. 5 in detail. A software training method in which the training code TC is loaded into working memory 200 in a manner to release (or deactivate) the channel interleaving is described with reference to FIG. 6.

If the software training procedure S140 starts, in operation S141, host 100 releases or deactivates the channel interleaving mode of memory controller 120. As the channel interleaving mode is released or deactivated, host 100 may intensively write specific data in an area corresponding to any one channel of working memory 200. That is, as the channel interleaving is released, host 100 does not need to store data in working memory 200 after partitioning the data.

In operation S143, host 100 loads the training code TC and training data TD to working memory 200 while the channel interleaving is released or deactivated. Host 100 loads the training code TC to a first memory area corresponding to a first channel. Host 100 writes the training data TD in a second memory area corresponding to a second channel. The first channel may be any one of a plurality of channels. The first memory area may be a memory area or a memory die that is accessible through the first channel In addition, the second channel may be one or more channels among the remaining channels of the plurality of channels other than the first channel. Accordingly, the second memory area may be a memory area (or a memory die) of all memory areas of working memory 200, except the first area.

In operation S145, host 100 may fetch and execute the training code TC loaded into the first memory area. For example, CPU 110 may fetch and execute the training code TC that is allocated for the software training. As the training code TC is executed, training is performed on a memory area or a memory die or dies corresponding to the second memory area. In this case, the training data TD written in the second memory area may be read, and host 100 may evaluate the read training data to determine an optimum parameter.

In operation S147, host 100 reloads the training code TC and training data TD to working memory 200. In contrast to operation S143, however, here host 100 loads the training code TC to the second memory area corresponding to the second channel. Also, host 100 may write the training data TD in the first memory area corresponding to the first channel.

In operation S149, host 100 may fetch and execute the training code TC loaded into the second memory area. For example, the CPU 110 may fetch and execute the training code TC that is allocated for the software training. As the training code TC is executed, training is performed on a memory area or a memory die or dies corresponding to the first memory area. In this case, the training data TD written in the first memory area may be read, and host 100 may evaluate the read training data to determine an optimum parameter corresponding to the first memory area. If the software training that is performed on all memory areas or dies (or chips) of working memory 200 based on the above-described procedure is completed, operation S140 ends.

A method in which the training code TC is loaded into working memory 200 in a manner to release the channel interleaving is described above. A memory area to which the training code TC is loaded is substantially excluded from training. Accordingly, the software training may be performed at least twice to perform training on a memory area or a channel to which the training code TC is loaded.

Figure 7:
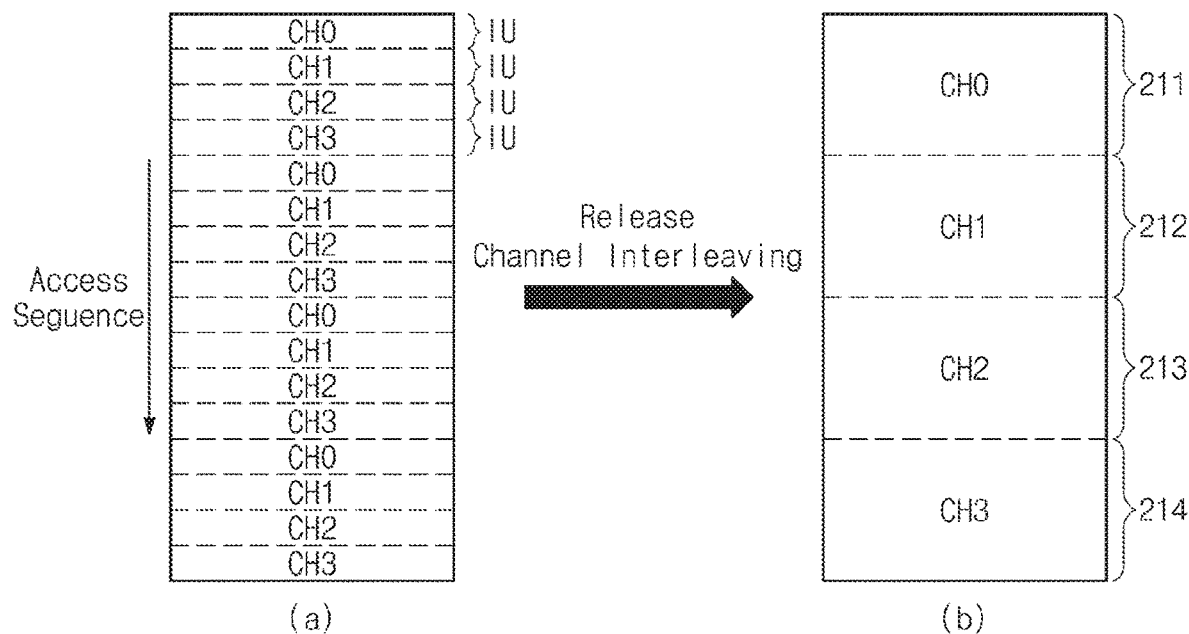
FIG. 7 is a block diagram illustrating a method of releasing channel interleaving of a memory controller described with reference to FIG. 6.

FIG. 7 is a block diagram illustrating a method of releasing or deactivating channel interleaving of memory controller 120 described with reference to FIG. 6. In particular, FIG. 7 shows a memory map (a) of working memory 200 before releasing or deactivating the channel interleaving, and a memory map (b) of working memory 200 after releasing or deactivating the channel interleaving.

Referring to the memory map (a) of working memory 200 before releasing or deactivating the channel interleaving, data is written in or read from working memory 200 in data chunks having the size of the interleaving unit IU. For example, in the case of writing data, the data is partitioned in the interleaving unit IU, and the partitioned portions of the data are scattered into and written in channels, respectively. For example, assuming that the interleaving sequence is "CH0→CH1→CH2→CH3→ . . . →CHn−1", the pieces of partitioned data of the size of the interleaving unit IU may be allocated to and written in the channels, respectively. During the read operation, channels may be selected in the same manner as that described above, such that read data is transferred to host 100 through the channels thus selected.

Referring to the memory map (b) after the releasing or deactivating the channel interleaving, the interleaving unit IU is no longer meaningful. That is, write data may be continuously written into a selected memory area or a selected chip (or die). Here, a memory area corresponding to the channel CH0 means the whole continuous memory area 211 connected to the channel CH0. Accordingly, the training code TC that is not partitioned may be loaded into memory area 211 corresponding to the channel CH0. It may be possible to write the training code TC, which is not partitioned, into each of memory areas 212, 213, and 214 corresponding to the channels CH1, CH2, and CH3, respectively.

Figure 8:
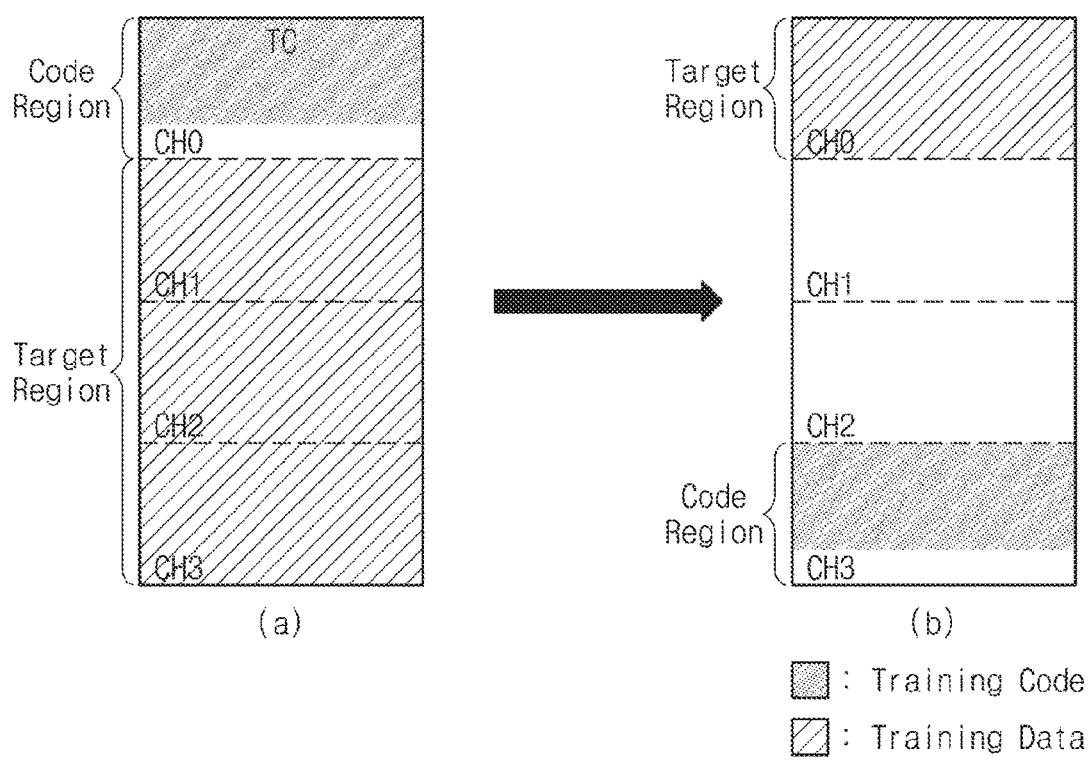
FIG. 8 is a drawing illustrating a method of loading the training code and training data to the working memory of which channel interleaving is released.

FIG. 8 is a drawing illustrating a method of loading the training code TC and training data to working memory 200 of which channel interleaving is released. Referring to FIG. 8, the loading of the training code TC is performed twice on working memory 200 of which the channel interleaving is released. The loading of the training code TC is performed twice on different memory areas of working memory 200.

First of all, the training code TC and the training data TD may be loaded in a way corresponding to operation S143 of FIG. 6. The training code TC is loaded into a memory area corresponding to the channel CH0. The training data TD may be written into memory areas that correspond to the channels CH1, CH2, and CH3, respectively. The memory area corresponding to the channel CH0 may have a capacity enough to contain the training code TC. Host 100 may execute fetch and execute the training code TC in a state where the training code TC is loaded. In this case, the software training may be performed on memory areas (or chips or dies) respectively corresponding to the channels CH1, CH2, and CH3 in which the training data TD is stored.

Next, the training code TC and the training data TD may be loaded in a way corresponding to operation S147 of FIG. 6 in a state where the training code TC is loaded. For example, the training code TC may be loaded into a memory area corresponding to the channel CH3. The training data TD may be written into a memory area that corresponds to the channel CH0. The training code TC and the training data TD are loaded into train a memory area of the channel CH0 that is not selected as a training target in operation S143 and operation S145. Host 100 may fetch and execute the training code TC in a state where the training code TC is loaded. In this case, the software training may be performed on the memory area (or a chip or a die) corresponding to the channel CH0 in which the training data TD are stored.

Figure 9:
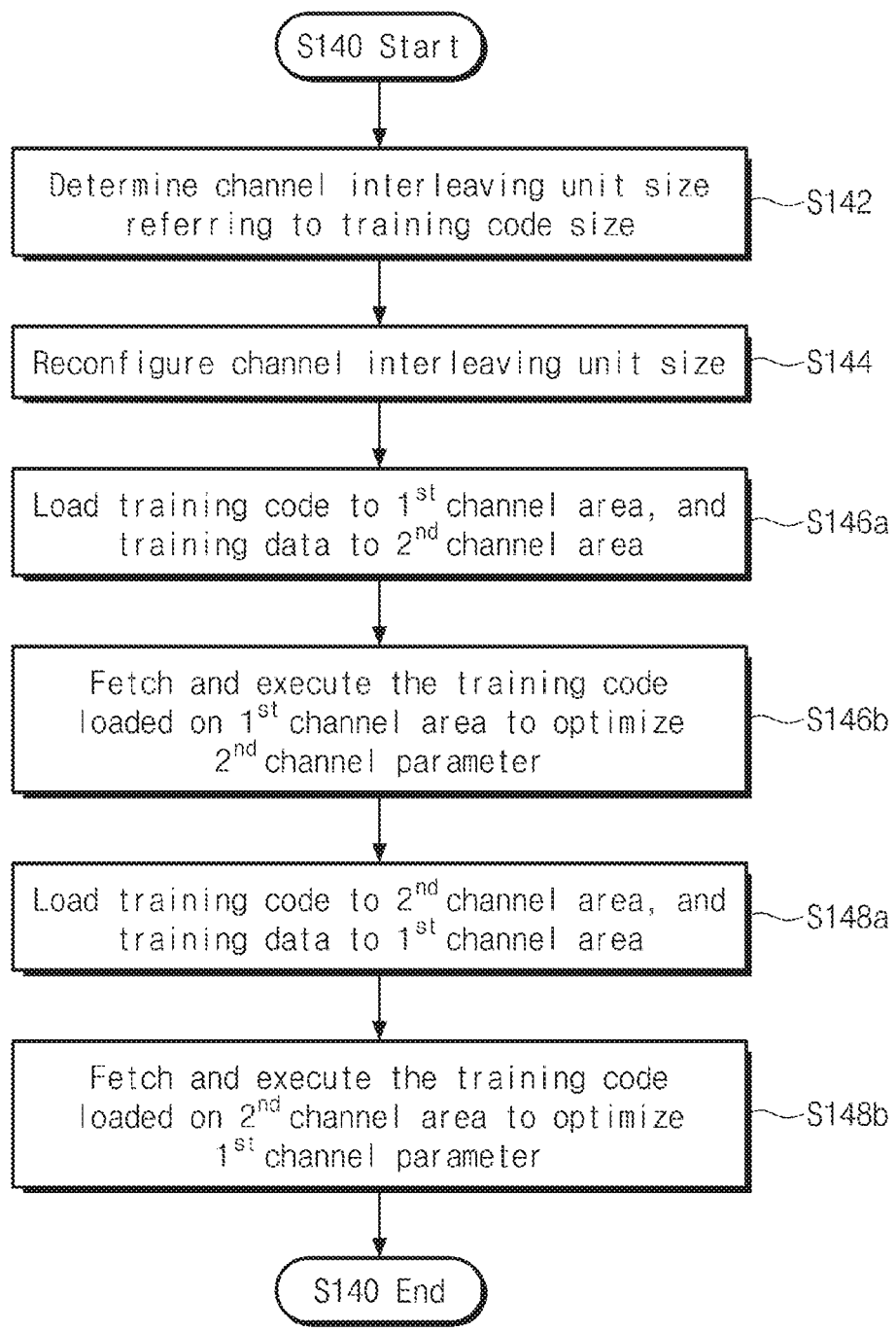
FIG. 9 is a flowchart illustrating another embodiment of a software training method.

FIG. 9 is a flowchart illustrating another embodiment of a software training method Referring to FIG. 9, the training code TC may be loaded into working memory 200 for the software training without the procedure such as releasing of the channel interleaving. According to another embodiment, the loading and executing of the training code TC may be made in operation S150 of FIG. 5.

If the software training procedure S140 starts, in operation S142, host 100 determines the size of the interleaving unit IU of a channel. For example, host 100 may determine the size of the interleaving unit IU of the channel, based on the size of the training code TC. It is assumed that a default value of the channel interleaving unit IU is 128 bytes and the size of the training code TC is 128 megabytes. According to the assumption, host 100 may increase the size of the interleaving unit IU of the channel by a factor of $10^6$.

In operation S144, host 100 may reconfigure settings of the channel interleaving based on the determined size of the interleaving unit IU of the channel. That is, host 100 may increase the size of the interleaving unit IU of the channel to such an extent as to accommodate the training code TC.

In operation S146a, host 100 loads the training code TC and training data TD into working memory 200 under the condition that the size of the channel interleaving unit IU is adjusted. Host 100 loads the training code TC into a first memory area corresponding to a first channel. Host 100 writes the training data TD into a second memory area corresponding to a second channel. Here, the first channel is one of a plurality of memory areas allocated for the channel interleaving. The second channel is a channel different from the first channel that is allocated for the channel interleaving.

In operation S146b, the host 100 may fetch and execute the training code TC loaded into the memory area of the first channel. As the training code TC is executed, training is performed on a memory area or a memory die or dies corresponding to the second channel. In this case, the training data TD written into the second memory area may be transferred to host 100. Host 100 may evaluate the read training data TD to determine an optimum access parameter corresponding to the second channel.

In operation S148a, host 100 reloads the training code TC and training data TD into working memory 200. In this case, host 100 loads the training code TC into the second memory area corresponding to the second channel. Host 100 may write the training data TD in the first memory area corresponding to the first channel.

In operation S148b, host 100 may fetch and execute the training code TC loaded into the memory area of the second channel. As the training code TC is executed, training is performed on a memory area or a memory die or dies corresponding to the first channel. In this case, the training data TD written into the first memory area may be transferred to host 100 after being read from the first memory area. Host 100 may evaluate the read training data TD to determine an optimum access parameter corresponding to the first channel.

The software training may be performed on all memory areas or dies (or chips) of working memory 200 without releasing or deactivating the channel interleaving based on the above-described procedure.

Figure 10:
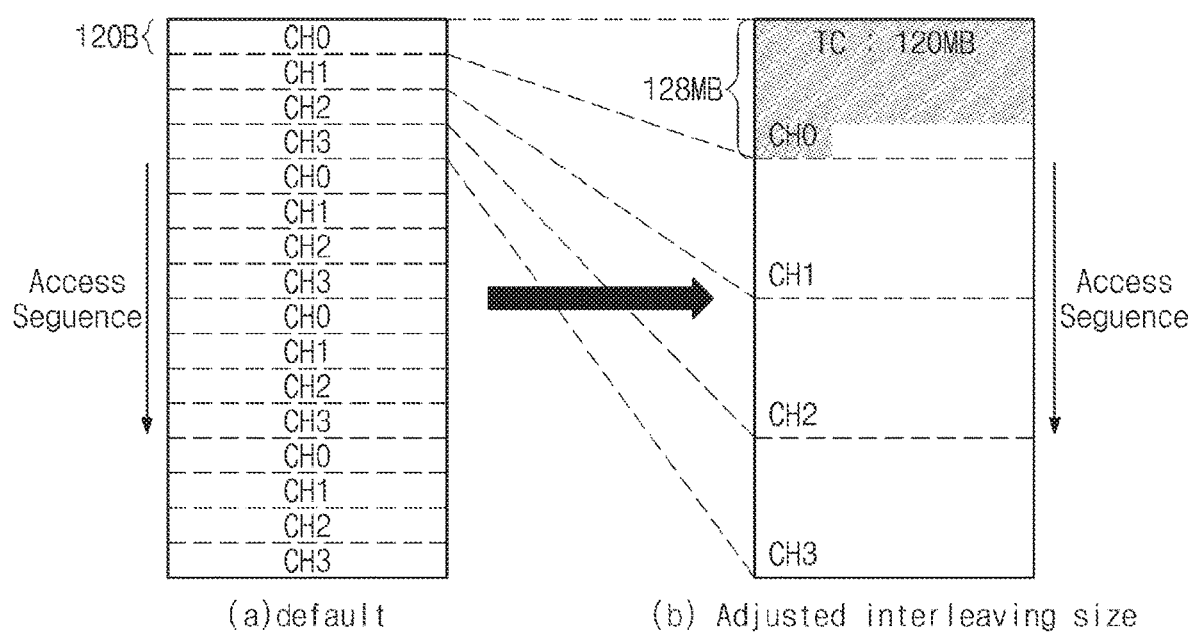
FIG. 10 is a block diagram illustrating an embodiment of a training code loading method.

FIG. 10 is a block diagram illustrating an embodiment of a training code loading method. Referring to FIG. 10, even though the channel interleaving of working memory 200 is not released or deactivated, the training code TC may be loaded into working memory 200 without partitioning of the training code TC.

Referring to a memory map (a) in which the interleaving unit IU corresponds to a default value, the interleaving unit IU is assumed as being 128 bytes. Also, it is assumed that the size of the training code TC that is not partitioned is 120 megabytes. If the training code TC is loaded into working memory 200 under the above conditions, the training code TC may be partitioned in units of 128 bytes. The partitioned portions of the training code TC may be scattered over all memory chips (or dies) existing in working memory 200.

However, referring to a memory map (b) in which the channel interleaving unit IU is adjusted in consideration of the size of the training code TC, the training code TC may be loaded to a channel of the interleaving unit IU without partitioning. That is, the training code TC of a 120-megabyte size may be contained in the channel of which the channel interleaving unit IU is adjusted to have the size of, for example, 128 megabytes. Accordingly, it is understood that the training code TC is all stored in one chip or die.

If the training code TC loaded to the channel CH0 is executed without releasing of the channel interleaving under the above condition, it may be possible to perform the software training on other channels CH1, CH2, and CH3.

Figure 11:
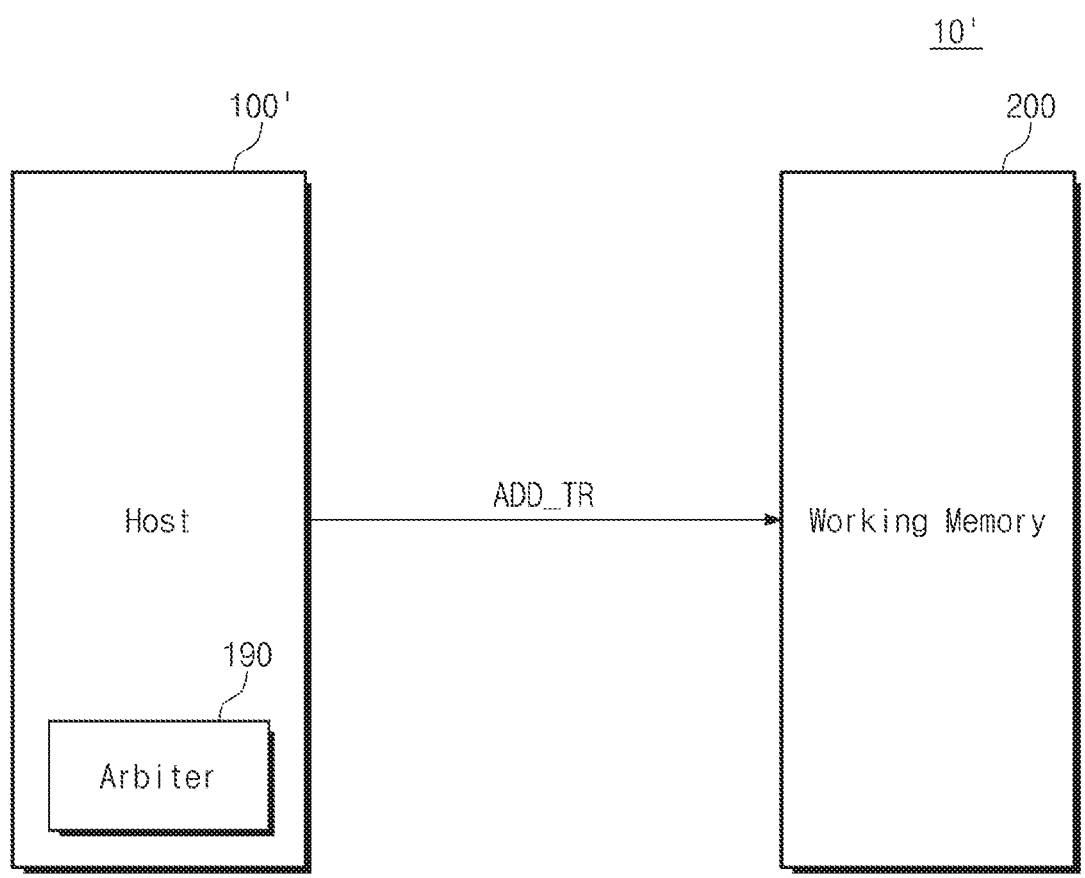
FIG. 11 is a block diagram illustrating another embodiment of an electronic device performing software training.

FIG. 11 is a block diagram illustrating another embodiment of an electronic device 10' performing software training. Referring to FIG. 11, a host 100' may include an arbiter 190 that is activated in a software training mode. An address ADD_TR that is obtained by remapping an address generated according to a channel interleaving sequence by arbiter 190 may be provided to working memory 200.

Host 100' may perform software training on working memory 200 during a booting operation or a reset operation. In this case, an access address of working memory 200 generated in the channel interleaving mode may be arbitrated by arbiter 190. For example, the channel interleaving effect may be removed in a way to mask a specific bit value of the address generated in the channel interleaving mode. Arbiter 190 may be configured simply with a logic circuit that masks a specific bit of an address. However, it is well understood that an address conversion method of arbiter 190 is not limited to this disclosure. Arbiter 190 is illustrated as being a component. However, it may be well understood that arbiter 190 is implemented by software or algorithm.

Figure 12:
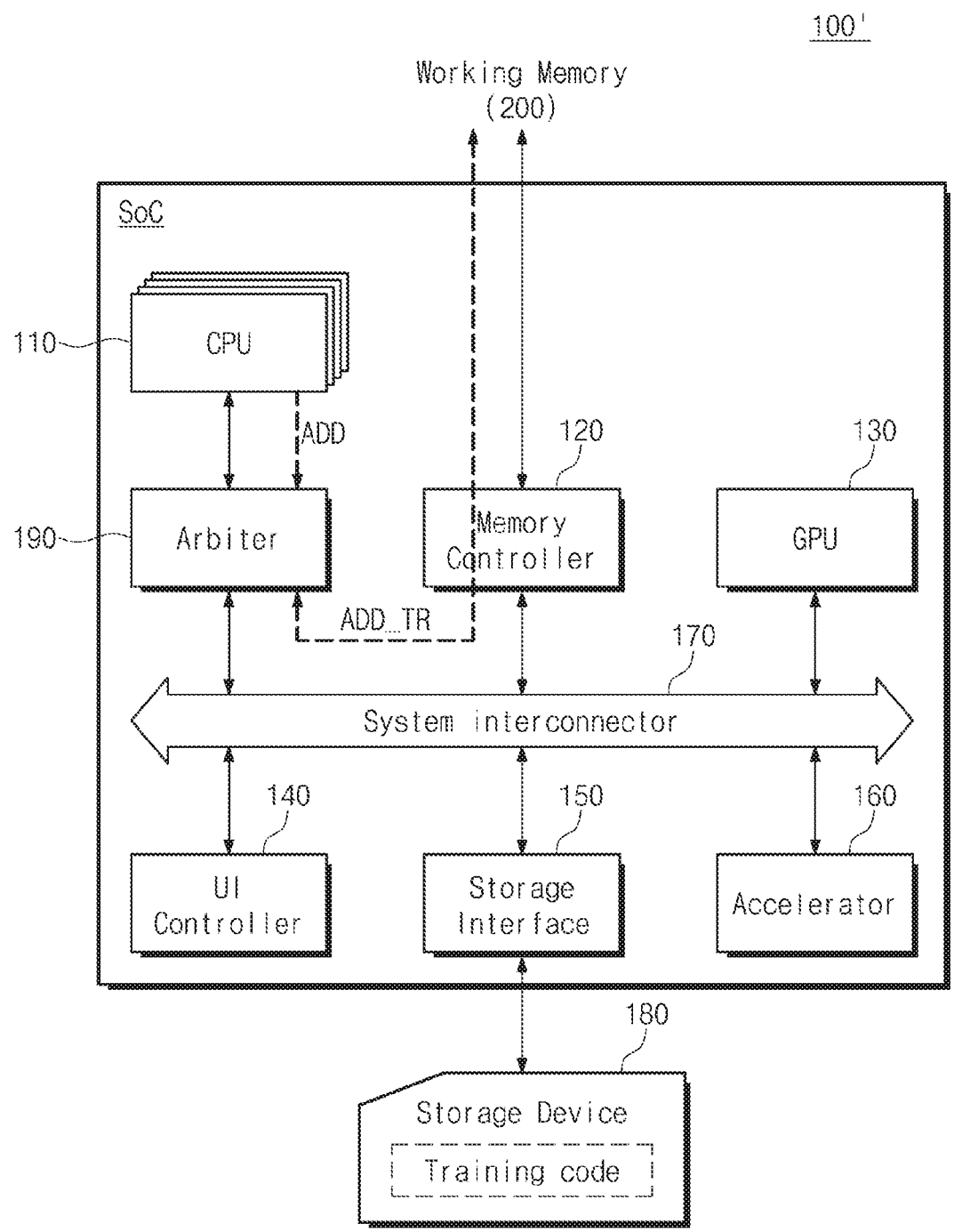
FIG. 12 is a block diagram illustrating an exemplary configuration of the host 100' of FIG. 11.

FIG. 12 is a block diagram illustrating an exemplary configuration of host 100' of FIG. 11. Referring to FIG. 12, host 100' may include a plurality of master components that request an access to working memory 200. For example, any one of a plurality of CPUs 110 may issue a request to access working memory 200 for the software training. Arbiter 190 may convert an access address of CPU 110 and may provide the converted address to memory controller 120. Here, a configuration of host 100' is substantially same as the host 100 of FIG. 2 except host 100' includes arbiter 190. Descriptions of CPU(s) 110, memory controller 120, GPU 130, UI controller 140, accelerator 160, and system interconnector 180 are thus omitted.

Arbiter 190 may be placed between system interconnector 170 and CPU(s) 110 performing the software training. An address conversion operation of arbiter 190 is activated in the software training mode. To load the training code TC or the training data TD, an address that a CPU 110 generates is adjusted (or changed) to a conversion address ADD_TR by arbiter 190. The conversion address ADD_TR may be provided to working memory 200 over system interconnector 170 and memory controller 120.

Figure 13:
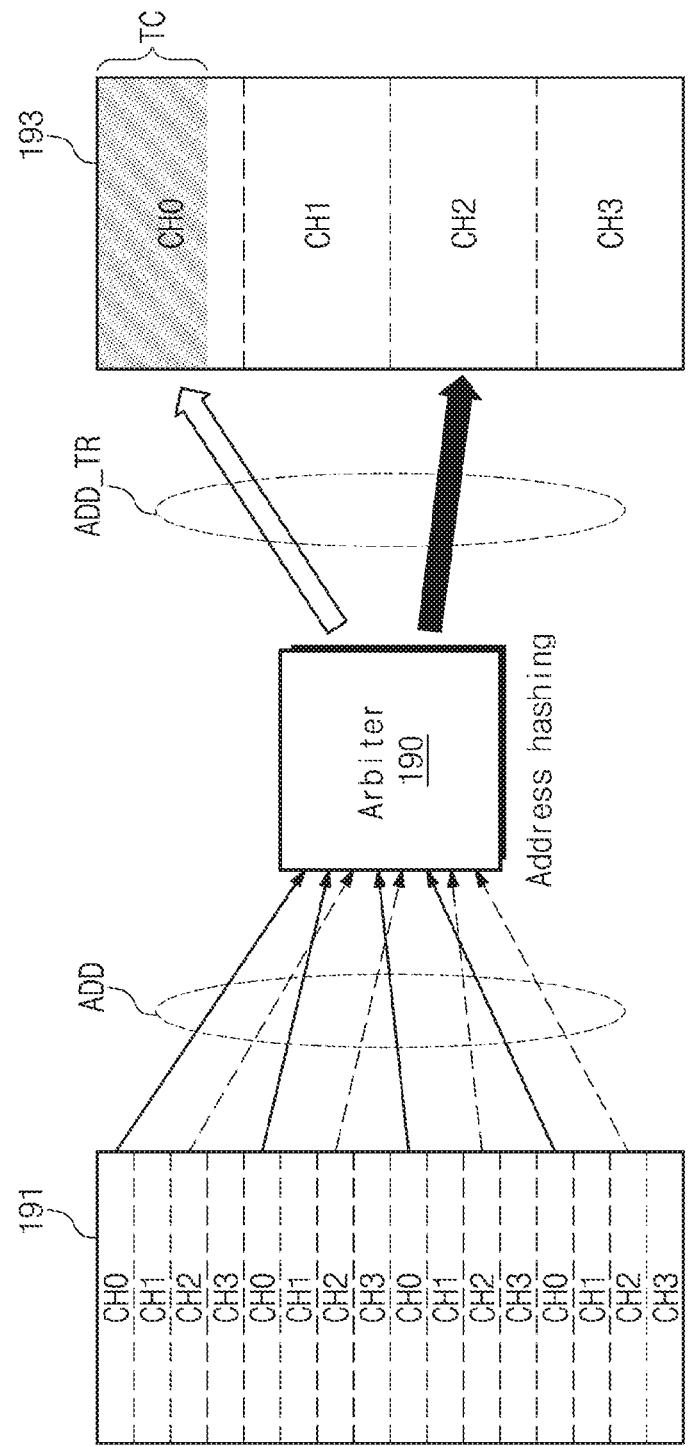
FIG. 13 is a block diagram illustrating an operation of an arbiter.

FIG. 13 is a block diagram illustrating an operation of arbiter 190. Referring to FIG. 13, in the software training mode, arbiter 190 may remap or rearrange or translate an address ADD for the channel interleaving, which CPU 110 generates, to the conversion address ADD_TR.

In the software training mode, CPU 110 may request the training code TC from storage device 180 based on a general training procedure. CPU 110 may issue an instruction and an address ADD of the channel interleaving mode, which are used to load the training code TC to working memory 200. On the basis of the address ADD of the channel interleaving mode generated by CPU 110, CPU 110 recognizes working memory 200 like a memory map 191.

Arbiter 190 rearranges the address ADD of the channel interleaving mode, which CPU 110 generates, to the conversion address ADD_TR for the software training. Arbiter 190 may generate the conversion address ADD_TR by masking a specific bit of the address ADD that is generated in the channel interleaving manner. On the basis of the conversion address ADD_TR, arbiter 190 recognizes working memory 200 like a memory map 193.

As arbiter 190 is activated, CPU 110 may load the training code TC to working memory 200 while maintaining the channel interleaving mode. However, through the arbitration of arbiter 190, the training code TC may be stored in a memory area corresponding to any one channel without partitioning.

Figure 14:
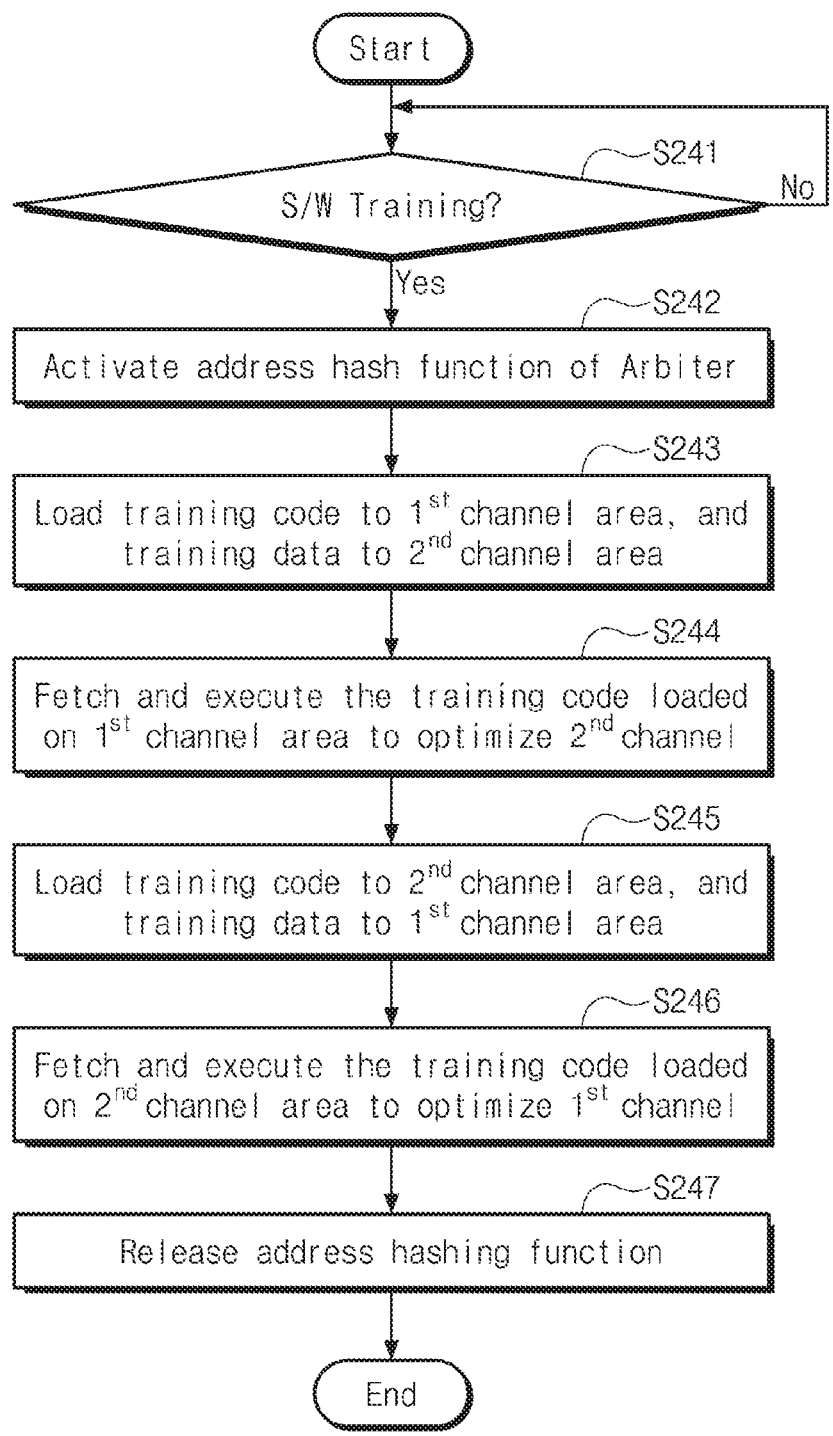
FIG. 14 is a flowchart illustrating a software training procedure of the host including the arbiter.

FIG. 14 is a flowchart illustrating a software training procedure of host 100 including arbiter 190. Referring to FIG. 14, arbiter 190 that performs address hashing in the software training mode is activated. The training code TC may be loaded into a memory area corresponding to any one channel without partitioning.

In operation S241, CPU 110 determines whether a current mode of operation is a software training mode. If it is determined that the current mode of operation is the software training mode, the procedure may proceed to operation S242 to activate arbiter 190. However, if it is determined that the current mode of operation is not the software training mode, operation S241 is repeated until the software training mode is activated.

In operation S242, CPU 110 activates arbiter 190 that adjusts an address of working memory 200, to which the training code TC or the training data TD will be loaded. That is, as arbiter 190 is activated, an address hashing function that arbiter 190 performs may be activated.

In operation S243, CPU 110 may issue an instruction and an address ADD for loading the training code TC and training data TD to working memory 200. The address ADD is converted into the conversion address ADD_TR by the address hashing function of arbiter 190. Accordingly, the training code TC may be loaded into a memory area corresponding to a first channel without partitioning. The training data TD may be loaded into a second memory area corresponding to a second channel.

In operation S244, host 100 may fetch and execute the training code TC loaded into the memory area of the first channel. As the training code TC is executed, training is performed on a memory area or a memory die or dies corresponding to the second channel. In this case, the training data TD written into the second memory area may be transferred to host 100. Host 100 may evaluate the read training data TD to determine an optimum access parameter corresponding to the second channel.

In operation S245, CPU 110 may issue an instruction and an address ADD for allocating the training code TC and training data TD to a channel different from that described in operation S243. The address ADD is converted into the conversion address ADD_TR by the address hashing function of arbiter 190. Accordingly, the training code TC may be loaded into a memory area corresponding to the second channel without partitioning. The training data TD may be loaded into a first memory area corresponding to the first channel.

In operation S246, host 100 may fetch and execute the training code TC loaded into the memory area of the second channel. As the training code TC is executed, training is performed on a memory area or a memory die or dies corresponding to the first channel. In this case, the training data TD written in the first memory area may be transferred to host 100 after being read from the first memory area. Host 100 may evaluate the read training data TD to determine an optimum access parameter corresponding to the first channel.

In operation S247, host 100 releases the address hashing function of the arbiter 190 as the software training mode is completed. As described above, the training code TC for the software training may be executed after being loaded into working memory 200.

Figure 15:
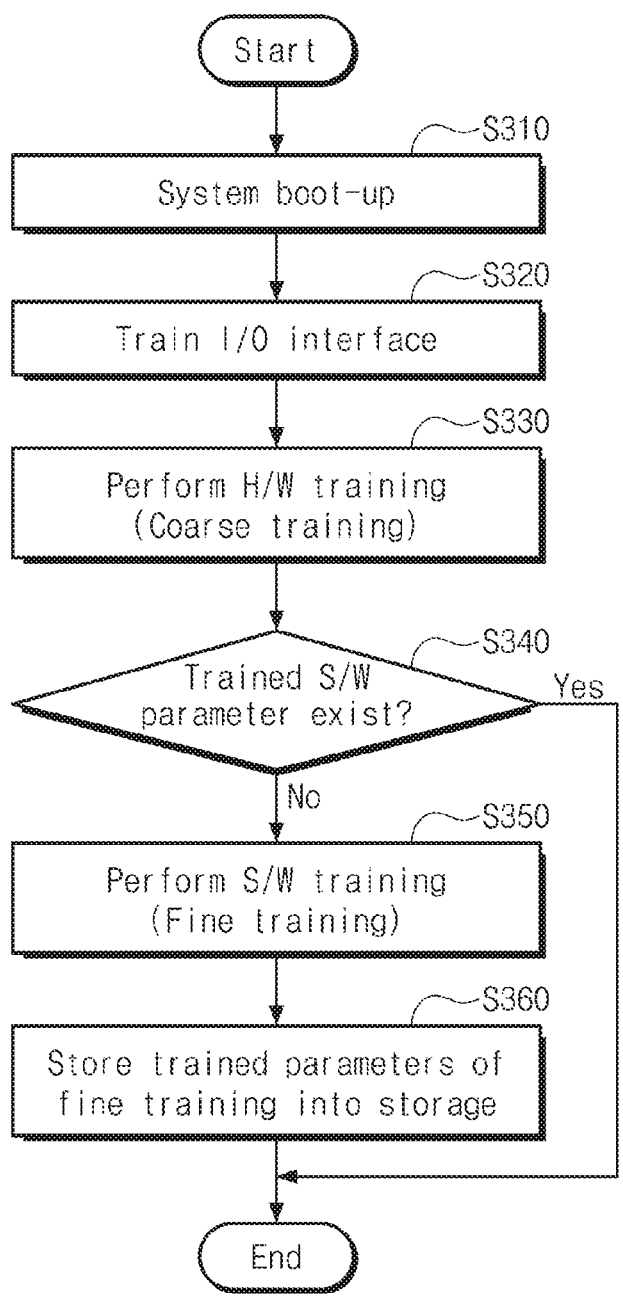
FIG. 15 is a flowchart illustrating an embodiment of a method of using an access parameter generated through software training.

FIG. 15 is a flowchart illustrating a method of using an access parameter generated through software training, according to an embodiment of the inventive concept. Referring to FIG. 15, the result of the software training is applied to a booting operation to be performed later, thereby improving a booting speed of electronic device 10. Here, it is assumed that an access parameter that is generated through the software training is stored in storage device 180 or in a nonvolatile memory device of host 100.

In operation S310, electronic device 10 is booted up. For example, a power switch of electronic device 10 may be turned on, or a booting operation thereof may be performed when an initialization operation is performed by a reset.

In operation S320, training may be performed on overall input/output interfaces of electronic device 10. Before training of working memory is performed on working memory 200, training operations for the I/O interface for securing minimum reliability may be performed in operation S320.

In operation S330, hardware training is performed on working memory 200. The hardware training may be, for example, an operation of setting memory controller 120 with an initial value parameter that is previously defined in working memory 200. The minimum reliability for an access to working memory 200 may be obtained through the hardware training. The hardware training may be called "coarse training".

In operation S340, whether an access parameter generated through previous software training exists in electronic device 10 is determined. If it is determined that the access parameter generated through a previous software training procedure exists in electronic device 10 (Yes), the training of the working memory 200 ends. In contrast, if it is determined that the access parameter generated through a previous software training operation does not exist in electronic device 10 (No), the procedure may proceed to operation S350.

In operation S350, software training is performed on working memory 200. The software training corresponds to fine training for finely adjusting the parameter that is determined by the hardware training.

In operation S360, an optimized operation parameter that is determined based on the result of the software training may be stored in storage device 180.

According to the above-described embodiment, the access parameter that is obtained through the software training operation may be applied to each booting operation without executing the software training again. Accordingly, it may be possible to save time or resources needed to perform the software training in the booting operation.

Figure 16:
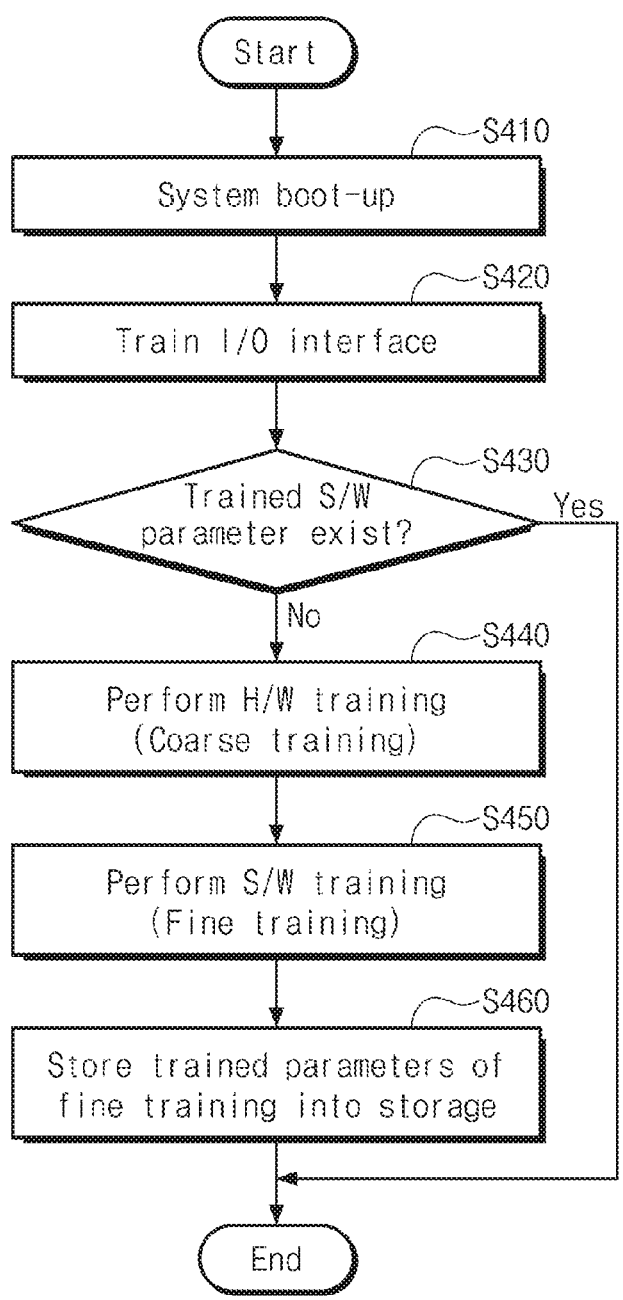
FIG. 16 is a flowchart illustrating another embodiment of a method of using an access parameter generated through software training.

FIG. 16 is a flowchart illustrating another embodiment of a method of using an access parameter generated through software training. Referring to FIG. 16, it may be possible to skip a hardware training procedure and a software training procedure by using an access parameter generated through software training. Operation S410, operation S420, operation S440, operation S450, and operation S460 are substantially the same as operations S310, S320, S330 and S350, respectively, of FIG. 15, and a detailed description thereof is thus omitted.

In operation S410, electronic device 10 is booted up. In operation S420, training is performed on overall input/output interfaces of electronic device 10.

In operation S430, whether an access parameter generated through a previous software training operation exists is determined. If it is determined that the access parameter generated through the previous software training exists (Yes), the training of working memory 200 ends. In contrast, if it is determined that the access parameter generated through the previous software training does not exist (No), the procedure may proceed to operation S440.

In operation S440, hardware training is performed on working memory 200. In operation S450, software training is performed. In operation S460, an optimized operation parameter that is determined based on the result of the software training is stored.

With the above description, the access parameter obtained through the software training may make it possible to skip hardware training and software training upon boosting of electronic device 10. Accordingly, it may be possible to save a time or resources needed to perform the software training in the booting operation.

According to an embodiment of the inventive concept, a training code for training a memory channel may be executed after being loaded into a DRAM. Accordingly, the memory channel may be trained with higher reliability without restriction on the size of the training code. In addition, a time needed to train the memory channel may be markedly reduced by fetching the training code from a high-speed DRAM.

While the inventive concept has been described with reference to exemplary embodiments, it will be apparent to those skilled in the art that various changes and modifications may be made without departing from the spirit and scope of the inventive concept. Therefore, it should be understood that the above embodiments are not limiting, but illustrative.

What is claimed is:

1. An electronic device, comprising:
a memory device configured to store data and comprising a first memory area corresponding to a first channel and a second memory area corresponding to a second channel; and
a system-on-a-chip that uses the memory device as a working memory,
wherein the system-on-a-chip deactivates a channel interleaving mode associated with the memory device, loads a training code to the first memory area after deactivating the channel interleaving mode for optimizing operational characteristics of the second memory area into the first memory area of the memory device, loads training data to the second memory area, and performs software training on the second memory area of the memory device by executing the loaded training code to optimize operational characteristics of the second memory area.

2. The electronic device of claim 1, wherein the system-on-a-chip loads the training data to the second memory area for testing and adjusting an access parameter of the second memory area upon the execution of the training code.

3. The electronic device of claim 1, wherein the first memory area is included in a memory unit corresponding to a first channel of the memory device, and the second memory area is included in a memory unit corresponding to a second channel thereof.

4. The electronic device of claim 1, wherein the system-on-a-chip loads the training code to the first memory area after adjusting a size of a channel interleaving unit for channel interleaving associated with the memory device.

5. The electronic device of claim 4, wherein the size of the channel interleaving unit is adjusted based on a size of the training code.

6. The electronic device of claim 5, wherein the channel interleaving unit is adjusted to have a size greater than the size of the training code.

7. The electronic device of claim 1, wherein the system-on-a-chip comprises an arbiter that generates a conversion address, which is mapped such that the training code is continuously stored in the first memory area of the memory device, based on a channel interleaving address generated in a mode of operation in which the software training is performed.

8. The electronic device of claim 7, wherein the arbiter generates the conversion address by masking a specific bit of the channel interleaving address.

9. The electronic device of claim 1, wherein the system-on-a-chip further performs the software training on the first memory area by loading the training code into the second area and executing the loaded training code.

10. A software training method of an electronic device that drives a memory device managed in units of channels as a working memory, the method comprising:
deactivating a channel interleaving mode associated with the memory device;
loading a training code for optimizing operational characteristics of a second memory area of the memory device into a first memory area of the memory device corresponding to a first channel of the memory device after deactivating the channel interleaving mode, and loading training data into the second memory area of the memory device corresponding to a second channel of the memory device;
accessing the training data stored in the second memory area in response to execution of the training code loaded into the first memory area;
evaluating the training data read from the second memory area to ascertain an optimum value for an access parameter of the second channel; and
setting an operating condition of the second channel by using the ascertained optimum value for the access parameter.

11. The method of claim 10, further comprising:
adjusting a size of a channel interleaving unit of the memory device.

12. The method of claim 10, further comprising:
remapping a channel interleaving address of the memory device such that the training code is continuously stored in the first memory area of the memory device.

13. The method of claim 10, further comprising:
loading the training data into the first memory area and the training code into the second memory area;
executing the training code loaded into the second memory area; and
accessing the training data to determine an access parameter of the first channel, upon execution of the training code loaded into the second memory.

14. The method of claim 10, wherein the access parameter comprises timing between a data signal and a strobe signal or a reference value of a signal level.

15. A computing system, comprising:
a memory device that is driven as a working memory; and
a host connected to a plurality of channels and configured to load data to the memory device and to fetch the data from the memory device via the plurality of channels,
wherein the host deactivates a channel interleaving mode associated with the memory device, performs software training on a second channel of the plurality of channels by: loading a training code into a first memory area of the working memory corresponding to a first channel of the plurality of channels after deactivating the channel interleaving mode, loading training data into a second memory area of the working memory corresponding to a second channel of the plurality of channels after deactivating the channel interleaving mode, and executing the loaded training code to optimize operational characteristics of a second memory area of the working memory corresponding to the second channel of the plurality of channels.

16. The computing system of claim 15, wherein the host loads the training code into the memory area corresponding to the first channel after adjusting a size of a channel interleaving unit associated with the memory device.

17. The computing system of claim 15, wherein the host comprises an arbiter that hashes a channel interleaving address of the memory device to a continuous address.

* * * * *